United States Patent
Delmaere et al.

(10) Patent No.: US 10,537,033 B2
(45) Date of Patent: Jan. 14, 2020

(54) DISPLAY DEVICE FOR MOTOR VEHICLE

(71) Applicant: DAV, Créteil (FR)

(72) Inventors: Christophe Delmaere, Créteil (FR); Richard Geloen, Créteil (FR)

(73) Assignee: DAV, Créteil (FR)

( * ) Notice: Subject to any disclaimer, the term of this patent is extended or adjusted under 35 U.S.C. 154(b) by 337 days.

(21) Appl. No.: 15/527,868

(22) PCT Filed: Nov. 19, 2015

(86) PCT No.: PCT/FR2015/053145
§ 371 (c)(1),
(2) Date: May 18, 2017

(87) PCT Pub. No.: WO2016/079445
PCT Pub. Date: May 26, 2016

(65) Prior Publication Data
US 2018/0343752 A1    Nov. 29, 2018

(30) Foreign Application Priority Data
Nov. 19, 2014   (FR) ..................................... 14 02609

(51) Int. Cl.
*G06F 1/16*   (2006.01)
*H05K 5/00*   (2006.01)
(Continued)

(52) U.S. Cl.
CPC ........... *H05K 5/0017* (2013.01); *B60K 35/00* (2013.01); *G06F 3/03547* (2013.01);
(Continued)

(58) Field of Classification Search
CPC .......................... H05K 5/0017; G06F 1/1601
(Continued)

(56) References Cited

U.S. PATENT DOCUMENTS

| 6,400,260 B1* | 6/2002 | Tsai | ..................... G01R 31/006 340/439 |
| 8,531,825 B2* | 9/2013 | U | .............................. G09F 9/35 349/60 |

(Continued)

FOREIGN PATENT DOCUMENTS

| JP | 2002-286073 A | 10/2002 |
| WO | 2014/102470 A1 | 7/2014 |
| WO | 2014/154956 A2 | 10/2014 |

OTHER PUBLICATIONS

International Search Report issued in PCT/FR2015/053145 dated Mar. 15, 2016 (2 pages).
(Continued)

Primary Examiner — Anthony Q Edwards
(74) Attorney, Agent, or Firm — Osha Liang LLP

(57) ABSTRACT

The present invention relates to a display device (1) for a motor vehicle, which includes: a display module (3) comprising a flat screen (7) provided on the rear surface thereof with mounting feet (17), each mounting foot (17) including a tapped hole for receiving a mounting screw (21); and a housing (9) holding the display module (3), said housing (9) having a bottom wall (23) and on which the mounting feet (1) of the flat screen (7) are mounted by screwing, characterised in that it also comprises a membrane made of resilient material (29) arranged between the mounting feet (17) and covering each mounting foot (17) so as to be inserted between the mounting feet (17) and the bottom wall (23) of the housing (9), and in that the mounting screws (17) of the flat screen (7) pass through the bottom wall (23) and the membrane made of resilient material (29) so as to engage with the tapped hole of each foot (17).

11 Claims, 1 Drawing Sheet

(51) Int. Cl.
*G06F 3/0354* (2013.01)
*B60K 35/00* (2006.01)
*H05K 7/14* (2006.01)

(52) U.S. Cl.
CPC ...... *H05K 7/1427* (2013.01); *B60K 2370/143* (2019.05); *B60K 2370/52* (2019.05)

(58) Field of Classification Search
USPC .......................... 361/679.01, 679.02, 679.21
See application file for complete search history.

(56) References Cited

U.S. PATENT DOCUMENTS

| | | | | |
|---|---|---|---|---|
| 9,170,447 B2* | 10/2015 | Mochizuki | ........ | G02F 1/133308 |
| 2014/0267976 A1* | 9/2014 | Mochizuki | ........ | G02F 1/133308 |
| | | | | 349/60 |
| 2015/0029688 A1* | 1/2015 | Fujita | ................... | H05K 5/0017 |
| | | | | 361/753 |

OTHER PUBLICATIONS

Written Opinion of the International Searching Authority issued in PCT/FR2015/053145 dated Mar. 15, 2016 (5 pages).

\* cited by examiner

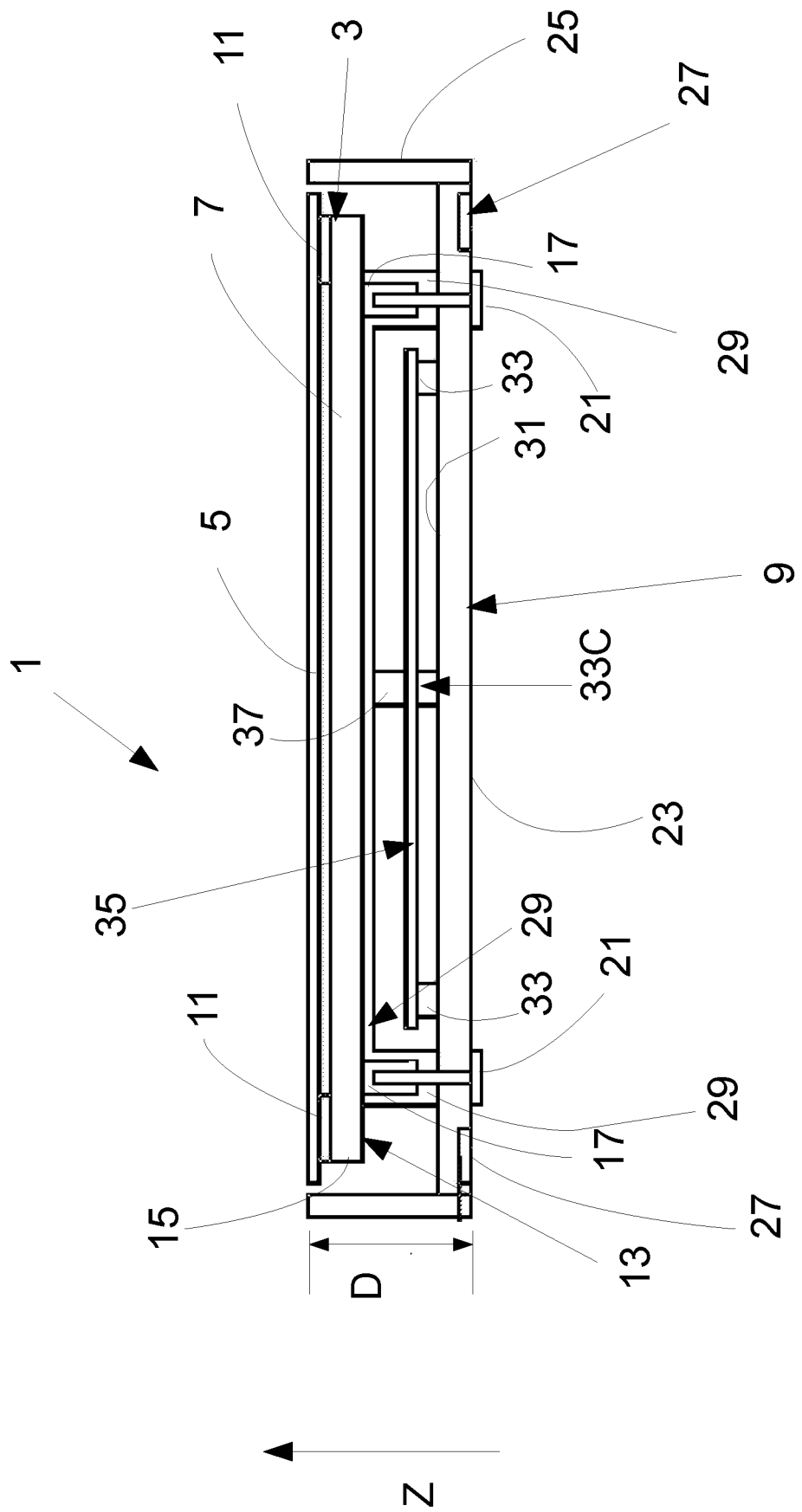

DISPLAY DEVICE FOR MOTOR VEHICLE

The present invention relates to a display device for a motor vehicle.

Devices of this type are advantageously applied in the control and display panels of motor vehicles.

The presence of display devices in motor vehicles, notably comprising flat screens, is becoming increasingly common.

These display devices may comprise the flat screen alone, or may include a control touch pad, of the capacitive or resistive type for example, associated with the flat screen. In the latter case, the touch pad can be used to determine the parameters of the pressure of a user's finger. These pressures are then processed by a processing unit comprising a microprocessor, for example, for controlling various functions of the vehicle, such as the functions of air conditioning, an audio system, a telephone communication system, a multimedia system, or a navigation system.

There are known display devices integrated with the control and display panel, in which the display device is integrated into a housing with its electronic control card, and with the touch pad, if present.

The stacking of these various elements gives rise to problems concerning tolerances. This is because, even if each element such as the housing, the display device and the touch pad are made with a small tolerance in serial production, their stacking has a rather large total tolerance, which is unacceptable for reasons of design.

There is also an increasing demand for the surface of the display device facing a user to lie flush with the surface of the fascia of the control and display panel. Mention is also made of a "flush" display unit, an English term signifying that the surface of the display device is in alignment with the fascia.

To achieve this, the distance between the display device, or the touch screen if appropriate, on the one hand, and a reference mark such as the real wall of the housing accommodating the display device on the other hand, must be controlled with high precision and reliability, particularly with a precision of less than 0.2 mm.

The present invention is intended to overcome some of the above problems, at least in part, by proposing a display device whose positioning to relative to a reference point on the housing can be controlled easily and precisely in order to overcome the problems of mechanical variations and tolerance in serial production.

To this end, the present invention relates to a motor vehicle display device comprising:
 on the one hand, a display module comprising a flat screen having fastening feet on its rear face, each fastening foot having a tapped hole to receive a fastening screw, and
 on the other hand, a housing accommodating the display module, said housing having a bottom wall to which the fastening feet of the flat screen are fastened by screwing,
 characterized in that it further comprises a membrane of elastic material placed between the fastening feet and covering each fastening foot so as to be interposed between the fastening feet and the bottom wall of the housing, and in that the screws for fastening the flat screen pass through the bottom wall and the membrane of elastic material to interact with the tapped hole of each foot.

The membrane is easily fastened on the rear of the display screen, particularly because it covers the fastening feet.

When the fastening screws are engaged through the membrane, the latter is compressed and the position along the direction z of the display module can be adjusted very precisely.

The display device may have one or more of the following characteristics, considered individually or in combination:

The membrane of elastic material is stretched between the fastening feet, allowing it to be placed against the rear of the display screen, thus enabling the screen to be protected against dust, for example.

The membrane of elastic material may be made of an elastomer, particularly silicone, and may have a Shore hardness in the range from 40 to 60 in particular, notably 50.

The device further comprises a printed circuit card positioned between the membrane of elastic material positioned against the rear face of the flat screen and the bottom wall of the housing.

The membrane also serves to protect the printed circuit card, notably from dust, and acts as a seal, particularly by enclosing the space around the printed circuit card.

The housing is made of metal, notably magnesium.

The bottom wall of the housing comprises, for example, protuberances in contact with a face of the electrical circuit card serving as a ground connection, and the membrane comprises, at least at the position of one of the protuberances of the bottom wall of the housing, compression studs for pressing the printed circuit card toward this protuberance of the bottom wall of the housing.

The compression stud of the membrane ensures that the ground connection is maintained even in the presence of strong vibrations to which the display device may be subjected.

The display module may further comprise a touch pad fastened to the flat display screen.

The touch pad is, for example, fastened to the flat display screen by a double-sided adhesive.

The invention also relates to a method for assembling a display device as defined above, characterized in that the flat screen is fastened by fastening screws passing through the bottom wall of the housing, by interaction with the tapped holes in the fastening feet, and the distance between the flat screen or the touch pad positioned on the flat screen on the one hand, and a reference on the rear face of the bottom wall of the housing on the other hand, is adjusted to a predefined value.

According to a particular aspect, the distance between the flat screen or the touch pad positioned on the flat screen on the one hand, and a reference on the rear face of the bottom wall of the housing on the other hand, is measured during the screwing operation, and the screwing is stopped when the predefined value is reached.

Other characteristics and advantages of the invention will be apparent from the following description, provided by way of non-limiting example, with reference to the attached drawing which shows, in a cross-sectional view, an exemplary embodiment of a display device according to the invention.

In FIG. 1, the reference 1 indicates the whole of a display device 1 for a motor vehicle according to an exemplary embodiment.

Such a display device 1 may, for example, be installed on the instrument panel, in a central location for example, so as to be accessible to both the driver and a passenger in the vehicle.

According to the illustrated example, the display device 1 comprises, as seen from the top toward the bottom of FIG. 1, on the one hand a display module 3 formed by a touch pad 5 and a flat display screen 7, and, on the other hand, a housing 9 accommodating the display module 3.

The touch pad 5 of the display module 3 is, for example, a capacitive touch pad, made to be transparent in order to permit the viewing of the information displayed on the flat display screen 7.

Thus the touch pad 5 may be made from two rigid transparent plates, of glass or clear polycarbonate for example, bonded to one another by optical adhesive and having transparent electrical tracks sandwiched between them, these tracks being connected to an electronic unit for capacitive detection. The upper plate may be coated with polarizing film to improve the visibility of the flat screen 7 in all ambient light conditions.

The touch pad 5 is, for example, fastened by bonding with double-sided adhesive 11 to the flat screen 7.

In a simplified version (not shown) of the display module 3, the latter comprises only the flat display screen 7.

The flat screen 7 is, for example, a liquid crystal or TFT screen, an LCD or LED screen, or an OLED screen. The rear face 13 of the flat screen, opposite the face having the LEDs, LCDs or other devices, and the side faces 15 are formed by a rigid support frame.

To fasten the flat screen 7 in the housing 9, the rear face 13 has fastening feet 17, each comprising a tapped hole to receive a fastening screw 21.

The housing 9 is, for example, made of metal in order conduct any electrostatic discharges to ground, as described below. The metal used is preferably magnesium, notably high-purity magnesium, because of its low weight, high mechanical strength, good corrosion-resistance, even without post-treatment, and its ease of shaping, for example by means of low-pressure molding (or "die casting", as it is called in English).

The housing 9 has a bottom wall 23 and side walls 25. It is therefore open at the top (as seen in FIG. 1).

On the rear face of its bottom wall 23, the housing 9 comprises references or reference points 27, from which the distance D to the upper face of the touch pad 5, or, for the simplified version without a touch pad 5, to the upper face of the flat screen 7, must be precisely adjusted.

The display device 1 also comprises a membrane 29 of elastic material, notably of elastomer, particularly silicone.

The membrane 29 has, for example, a Shore hardness in the range from 40 to 60, notably 50.

The membrane 29 is positioned, notably, so as to extend between the fastening feet 17, and covers each fastening foot 17 so as to be interposed between the fastening feet 17 and the bottom wall 23 of the housing 9.

The fastening screws 21 of the flat screen 7 pass through the bottom wall 23 and the membrane 29 of elastic material so as to interact with the tapped hole in each fastening foot 17. The fastening screws 21 are, for example, equipped with a locking device, particularly a polyamide locking device, to prevent any untimely unscrewing, due to vibration for example.

Thus the membrane 29 is easily fastened on the rear of the flat screen 7, particularly because it covers the fastening feet 17 with a single part to be positioned. When the fastening screws 21 are engaged through the membrane 29, the latter may be compressed and the position along the direction z, and therefore the distance D, of the display module may be adjusted very precisely relative to the references 27 of the housing 9.

It should be noted that the operation of screwing the screws 21 is not stopped on the basis of a torque, but on the basis of the distance D to be provided between the display module 3 and the reference or references 27. The membrane 29 may thus be compressed to compensate for the manufacturing variations or tolerances of the various elements of the display device 1.

Additionally, the face 31 of the bottom wall 23 of the housing 9 has protuberances 33 on which a printed circuit card 35 rests, this card being used, for example, for controlling the touch pad 5 and being electrically connected thereto by means of a multi-conductor flat cable (not shown) for example.

The printed circuit card 35 is therefore positioned between the membrane 29 of elastic material and the bottom wall 23 of the housing 9.

Thus the membrane 29 also serves to protect the printed circuit card 35, notably from dust, and acts as a seal.

At least one of the areas of the printed circuit card 35 in contact with the protuberances 33, notably a central area 33C, is electrically conductive and acts as an electrical connection between the ground of the printed circuit card 35 and the housing 9, in order to direct any electrostatic discharges toward the ground and thus prevent damage to the touch pad 5.

To ensure that this function is provided even in difficult conditions, notably in case of strong vibrations, the membrane 29 comprises, at least at the position of the protuberance 33C, a compression stud 37 to press the printed circuit card 35 against this protuberance 33C of the bottom wall 23 of the housing 9.

The compression stud 37 of the membrane 29 ensures that the ground connection is provided and maintained even in the presence of strong vibrations to which the display device 1 may be subjected.

In order to assemble the above display device 1, the flat screen 7 is fastened by fastening screws 17 passing through the bottom wall 23 of the housing 9, by interaction with the tapped holes in the fastening feet 17, and the distance D between the flat screen 7 or the touch pad 5 positioned on the flat screen 7, on the one hand, and a reference 27 on the rear face of the bottom wall 23 of the housing 9, on the other hand, is adjusted to a predefined value.

Provision is also made to measure the distance D during the screwing operation, and the screwing is stopped when the predefined value is reached. Thus the assembly process may be automated, and the screwing is controlled on the basis of the measurement of the distance D.

Evidently, the display device 1 according to the invention may be produced with a small degree of variation in the manufacturing dimensions. The membrane 29 not only acts as a buffer to enable manufacturing tolerances to be controlled, but also serves to protect the printed circuit card 35 against dust, on the one hand, and against the potentially harmful effects of electrostatic discharges on the other hand.

The invention claimed is:

1. A display device for a motor vehicle, comprising:
   a display module comprising a flat screen having fastening feet on a rear face of the flat screen, each fastening foot having a tapped hole to receive a fastening screw;
   a housing accommodating the display module, said housing having a bottom wall to which the fastening feet of the flat screen are fastened by screwing;
   a membrane of elastic material placed between the fastening feet and covering each fastening foot so as to be interposed between the fastening feet and the bottom wall of the housing; and
   a printed circuit card positioned between the membrane of elastic material positioned against the rear face of the flat screen and the bottom wall of the housing, wherein the screws for fastening the flat screen pass through the bottom wall and the membrane of elastic material to interact with the tapped hole of each foot, and wherein the bottom wall of the housing comprises protuberances in contact with a face of the printed circuit card, which is electrically conductive and serves as a ground connection.

2. The device as claimed in claim 1, wherein the membrane of elastic material extends between the fastening feet.

3. The device as claimed in claim 1, wherein the membrane of elastic material is made of silicone.

4. The device as claimed in claim 1, wherein the elastic material of the membrane has a Shore hardness in the range from 40 to 60.

5. The device as claimed in claim 1, wherein the housing is made of magnesium.

6. The device as claimed in claim 5, wherein the membrane comprises, at least at the position of one of the protuberances of the bottom wall of the housing, a compression stud for pressing the printed circuit card toward the one of the protuberances of the bottom wall of the housing.

7. The device as claimed in claim 1, wherein the display module further comprises a touch pad fastened to the flat display screen.

8. The device as claimed in claim 7, wherein the touch pad is fastened to the flat display screen by a double-sided adhesive.

9. A method for assembling a display device as claimed in claim 1, the method comprising:
fastening the flat screen by fastening screws passing through the bottom wall of the housing, by interaction with the tapped holes in the fastening feet,
fastening a touch pad to the flat display screen; and
adjusting a distance between the flat screen or the touch pad positioned on the flat screen, and a reference on the rear face of the bottom wall of the housing to a predefined value.

10. The method as claimed in claim 9, wherein the distance between the flat screen or the touch pad positioned on the flat screen and the reference on the rear face of the bottom wall of the housing is measured during the fastening of the flat screen by the fastening screws, and the fastening by the fastening screws is stopped when the predefined value is reached.

11. A display device for a motor vehicle, comprising:
a display module comprising a flat screen having fastening feet on a rear face of the flat screen, each fastening foot having a tapped hole to receive a fastening screw;
a housing accommodating the display module, said housing having a bottom wall to which the fastening feet of the flat screen are fastened by screwing;
a membrane of elastic material placed between the fastening feet and covering each fastening foot so as to be interposed between the fastening feet and the bottom wall of the housing; and
a printed circuit card positioned between the membrane of elastic material positioned against the rear face of the flat screen and the bottom wall of the housing,
wherein the screws for fastening the flat screen pass through the bottom wall and the membrane of elastic material to interact with the tapped hole of each foot,
wherein the bottom wall of the housing comprises protuberances in contact with a face of the printed circuit card, which is electrically conductive and serving as a ground connection,
wherein the membrane comprises, at least at the position of one of the protuberances of the bottom wall of the housing, a compression stud for pressing the printed circuit card toward the one of the protuberances of the bottom wall of the housing, and
wherein the housing is made of magnesium.

\* \* \* \* \*